(12) United States Patent
Wilkins

(10) Patent No.: US 8,873,238 B2
(45) Date of Patent: Oct. 28, 2014

(54) CHASSIS SYSTEM AND METHOD FOR HOLDING AND PROTECTING ELECTRONIC MODULES

(75) Inventor: Donald Frank Wilkins, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 297 days.

(21) Appl. No.: 13/493,803

(22) Filed: Jun. 11, 2012

(65) Prior Publication Data

US 2013/0329372 A1    Dec. 12, 2013

(51) Int. Cl.
*H05K 1/16*    (2006.01)

(52) U.S. Cl.
USPC ............ 361/724; 361/727; 361/730; 361/816

(58) Field of Classification Search
CPC . H05K 9/0066; H05K 9/0067; H05K 9/0068; H05K 9/0069; H05K 9/0071
USPC .......................................................... 361/724
See application file for complete search history.

(56) References Cited

U.S. PATENT DOCUMENTS

| | | | | |
|---|---|---|---|---|
| 4,631,641 A * | 12/1986 | Brombal et al. | ............... | 361/818 |
| 4,785,136 A * | 11/1988 | Mollet et al. | ................... | 174/363 |
| 4,872,212 A * | 10/1989 | Roos et al. | ...................... | 361/818 |
| 5,376,011 A * | 12/1994 | Rudy et al. | ....................... | 439/79 |
| 5,483,423 A * | 1/1996 | Lewis et al. | .................... | 361/816 |
| 5,808,303 A * | 9/1998 | Schlagheck et al. | .......... | 250/330 |
| 5,827,585 A * | 10/1998 | Giannetti | ...................... | 428/362 |
| 5,831,824 A * | 11/1998 | McDunn et al. | ............... | 361/699 |
| 5,858,509 A * | 1/1999 | Polch et al. | ..................... | 428/166 |
| 5,859,767 A * | 1/1999 | Fontana | ......................... | 361/818 |
| 6,274,807 B1 * | 8/2001 | Pommerenke et al. | ........ | 174/384 |
| 6,286,591 B1 * | 9/2001 | Bonneville | ..................... | 165/185 |
| 6,313,997 B1 * | 11/2001 | Speraw | ......................... | 361/741 |
| 6,351,374 B1 * | 2/2002 | Sherry | ..................... | 361/679.33 |
| 6,445,578 B1 * | 9/2002 | Bell et al. | ................. | 361/679.33 |
| 6,478,170 B1 * | 11/2002 | Zeidan et al. | ................. | 211/183 |
| 6,566,973 B2 * | 5/2003 | Schumacher | ................... | 333/12 |
| 6,697,258 B1 * | 2/2004 | Muhlfeld et al. | ............. | 361/729 |
| 6,727,820 B2 * | 4/2004 | Pedoeem et al. | ............. | 340/584 |
| 7,209,797 B2 * | 4/2007 | Kritchman et al. | ........... | 700/118 |
| 2001/0010629 A1 * | 8/2001 | Cherniski et al. | ............. | 361/818 |

OTHER PUBLICATIONS

ANSI/VITA 47/2005 (R2007), Environments, Design and Construction, Safety and Quality for Plug-In Modules, Sep. 2007, p. 1-22.

(Continued)

*Primary Examiner* — Anthony Q Edwards

(74) *Attorney, Agent, or Firm* — Klintworth & Rozenblat IP LLC

(57) ABSTRACT

A chassis system includes a body, a lid, a cavity, a backplane, and an electrically conductive connector. The lid is removably attached to the body such that when the lid is attached to the body a cavity within the body is completely enclosed by the body and the attached lid. The lid and the body are made of at least one material that does not allow electromagnetic waves to enter the cavity. The backplane is attached to the body or the lid. The electrically conductive connector is attached to the body or lid. The connector is in wired or wireless communication with the backplane for allowing electricity or data to flow between the electrically conductive connector and the backplane. The chassis system may be used to environmentally protect one or more electronic modules inserted into the cavity of the chassis system.

23 Claims, 5 Drawing Sheets

(56) References Cited

OTHER PUBLICATIONS

Karlsruhe Institute of Technology Press Release 186/2011, "Not Only Invisible, but Also Inaudible" Dec. 20, 2011 http://www.kit.edu/visit/pi_2011_8646.php.

Processing a Nickel Nanostrand and Nickel Coated Carbon Fiber Filled Conductive Polyethylene by Injection Molding, School of Technology, David A. Whitworth, Bringham Young University Thesis, Apr. 2010, pp. 1-130.

Shambat, Gary et al; "Ultrafast direct modulation of a single-mode photonic crystal nanocavity light-emitting diode" Nature Communications 2, Article No. 539 doi:10.1038/ncomms1543 Published Nov. 15, 2011 http://www.nature.com/ncomms/journal/v2/n11/full/ncomms1543.html.

Photonically Powered Remote Interface Unit, Dan Harres, I3 Report issued Dec. 15, 2011.

http://www.sciencemag.org/content1334/6058/962.full.

* cited by examiner

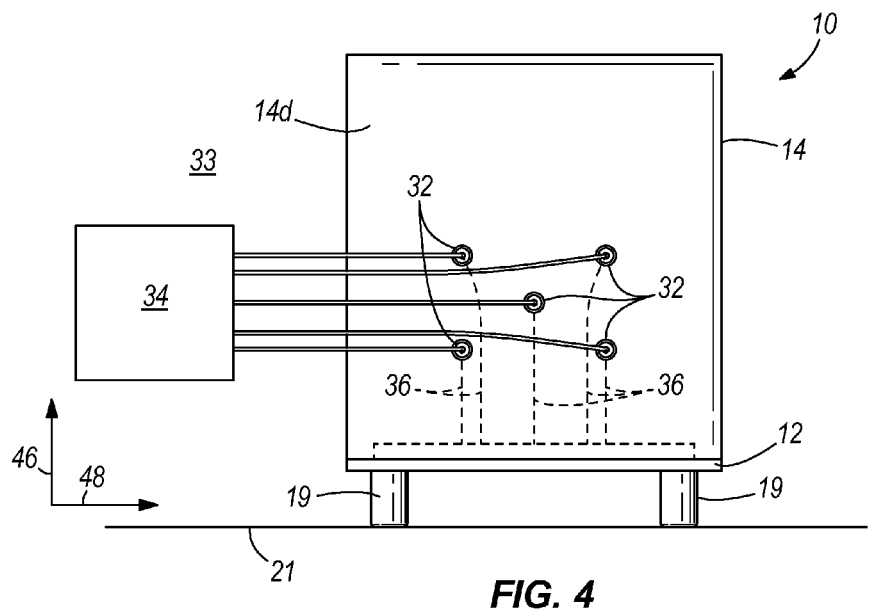
FIG. 4
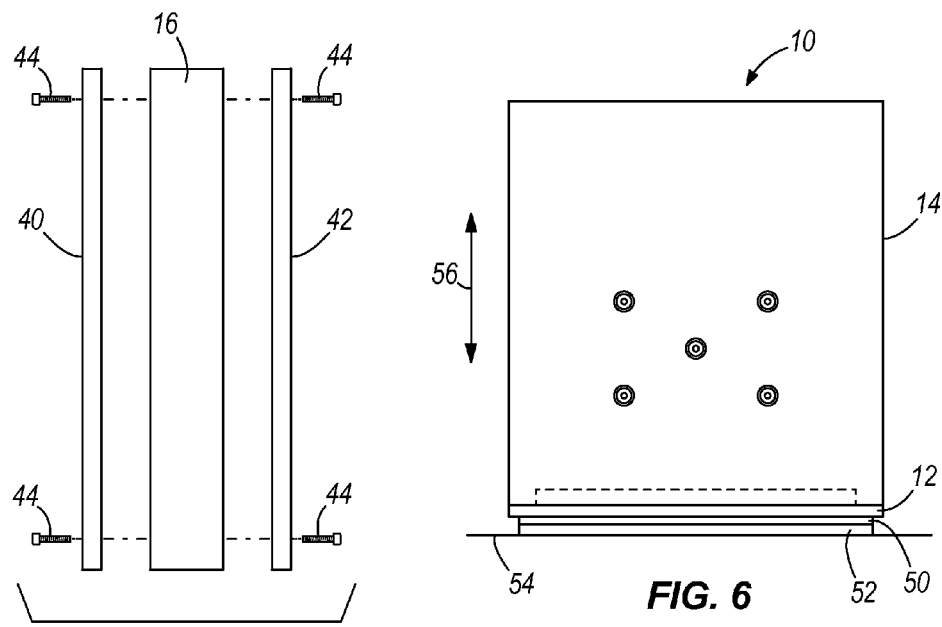
FIG. 5
FIG. 6

CHASSIS SYSTEM AND METHOD FOR HOLDING AND PROTECTING ELECTRONIC MODULES

FIELD OF THE DISCLOSURE

The disclosure relates to systems and methods for holding or protecting electronic modules from environmental conditions.

BACKGROUND OF THE DISCLOSURE

Electronic modules, such as commercial off the shelf modules, are typically not designed to survive in harsh environments such as in military or civilian aviation environments, or in other types of harsh environments. Integrating these electronic modules into a standard chassis does not reduce their environmental exposure and increases the risk that the electronic modules will fail.

There is a need for a chassis system and method which will protect electronic modules from harsh environments.

SUMMARY OF THE DISCLOSURE

In one embodiment, a chassis system includes a body, a lid, a cavity, a backplane, and an electrically conductive connector. The lid is removably attached to the body such that when the lid is attached to the body a cavity within the body is completely enclosed by the body and the attached lid. The lid and the body are made of at least one material that does not allow electromagnetic waves to enter the cavity. The backplane is attached to the body or the lid. The electrically conductive connector is attached to the body or lid. The connector is in wired or wireless communication with the backplane for allowing electricity or data to flow between the electrically conductive connector and the backplane.

In another embodiment, a chassis system includes a body, a lid, a plurality of spaced-apart thermally conductive rails, a backplane, at least one electronic module, and an electrically conductive connector. The lid is removably attached to the body such that when the lid is attached to the body a cavity within the body is completely enclosed by the body and the attached lid. The lid and the body are made of at least one material that does not allow electromagnetic waves to enter the cavity. The plurality of spaced-apart thermally conductive rails is attached to the body within the cavity. The backplane is attached to the body or the lid. The at least one electronic module is contained within the cavity between the plurality of spaced-apart thermally conductive rails and is in contact with the backplane. The electrically conductive connector is attached to the body or lid. The electrically conductive connector is in wired or wireless communication with the backplane for allowing electricity or data to flow between the electrically conductive connector and the backplane.

In still another embodiment, a method of manufacturing a chassis is disclosed. In one step, a chassis is formed. The formed chassis includes a body, a cavity within the body, and a lid such that when the lid is attached to the body the cavity is completely enclosed by the body and the lid. In another step, at least one electrical connector is molded to the lid or the body. In an additional step, at least one module securement member is molded to the lid or the body. In yet another step, a backplane is attached to the lid or the body. In another step, the backplane is connected, wired or wirelessly, to the at least one electrical connector to allow electricity or data to flow between the electrically conductive connector and the backplane.

These and other features, aspects and advantages of the disclosure will become better understood with reference to the following drawings, description and claims.

BRIEF DESCRIPTION OF THE DRAWINGS

FIG. 4 illustrates a side-view of the chassis system of FIG. 2 with metamaterial isolators attached to the lid and disposed against a structure;

FIG. 5 illustrates a perspective view of one of the plurality of electronic modules of the embodiment of FIG. 1 with outer shells of the electronic module removed from the electronic module;

FIG. 6 illustrates a side view of the chassis system of FIG. 2 with a thermoelectric layer and a shape memory alloy layer attached to the lid and disposed against a structure, in which the chassis system is installed, for reducing vibration of the chassis system.

DETAILED DESCRIPTION OF THE DISCLOSURE

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
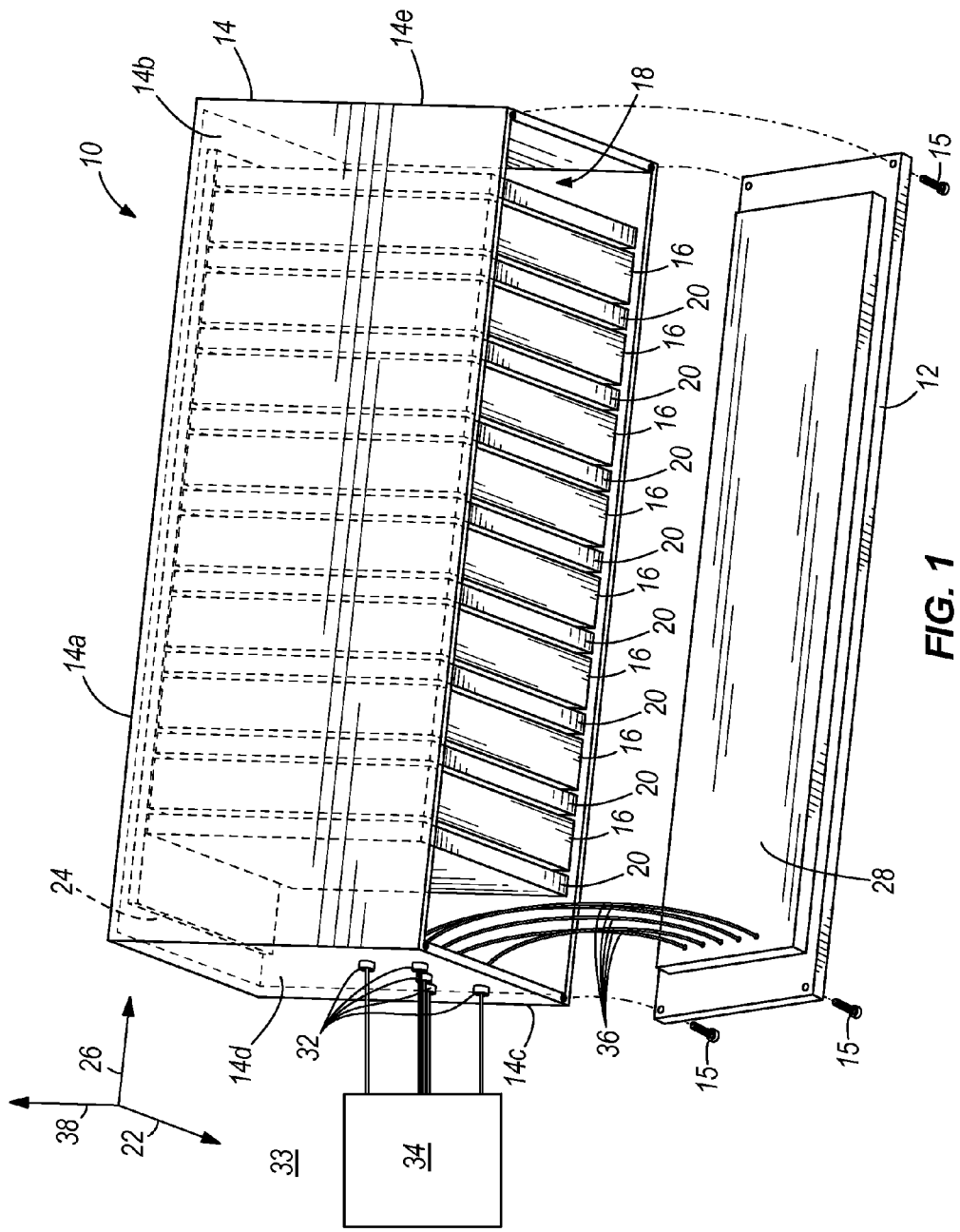
FIG. 1 illustrates a bottom perspective view of one embodiment of a chassis system with a lid removed from a body exposing electronic modules held within a cavity of the body.
Figure 2:
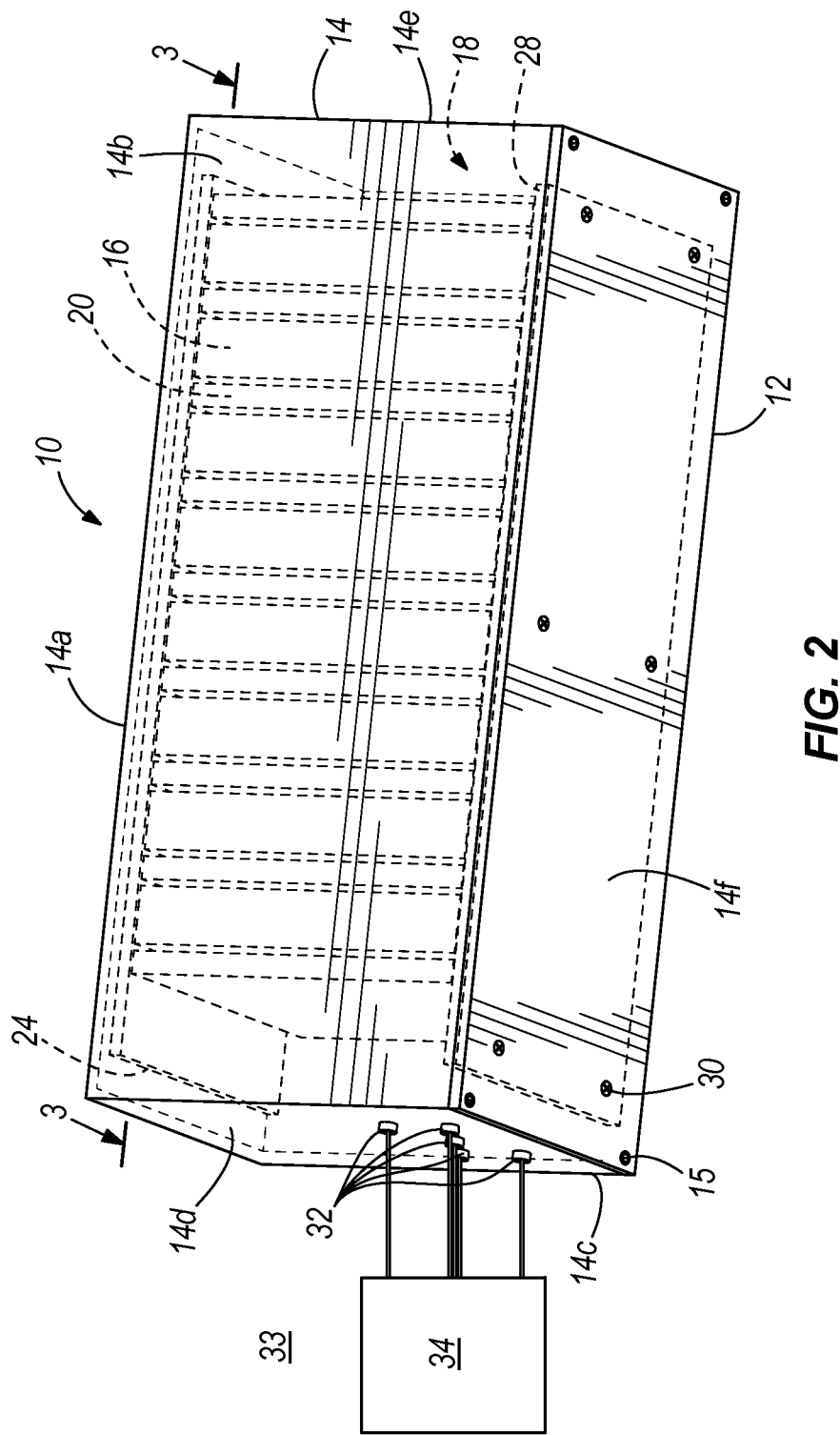
FIG. 2 illustrates a bottom perspective view of the chassis system of FIG. 1 with the lid attached to the body securing the electronic modules within the cavity of the body.
Figure 3:
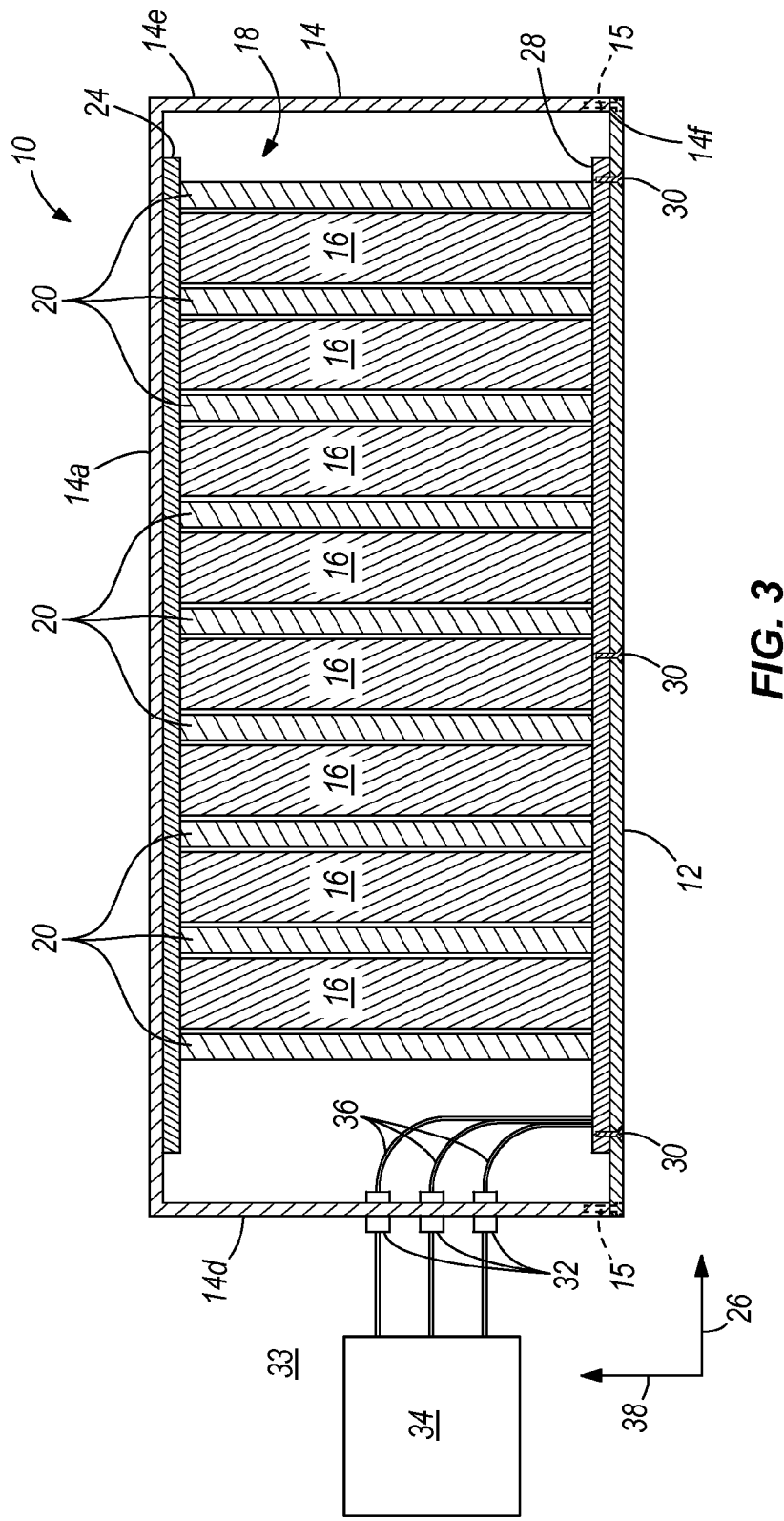
FIG. 3 illustrates a cross-section view through line 3-3 in the chassis system of FIG. 2.

FIG. 1 illustrates a bottom perspective view of one embodiment of a chassis system 10 with a lid 12 removed from a body 14 exposing electronic modules 16 held within a cavity 18 of the body 14. FIG. 2 illustrates a bottom perspective view of the chassis system 10 of FIG. 1 with the lid 12 attached to the body 14 securing the electronic modules 16 within the cavity 18 of the body 14. FIG. 3 illustrates a cross-section view through line 3-3 in the chassis system 10 of FIG. 2. FIG. 4 illustrates a side-view of the chassis system 10 of FIG. 2 with metamaterial isolators 19 attached to the lid 12 and disposed against a structure 21.

As shown in FIG. 1, the body 14 may comprise a top surface 14a, opposed lengthwise side surfaces 14b and 14c, and opposed widthwise end surfaces 14d and 14e. As shown in FIGS. 2 and 3, when the lid 12 is attached to the body 14 with one or more securement members 15, the lid 12 may cover a bottom 14f of the body 14 forming a rectangular shape and completely enclosing the cavity 18 within the lid 12 and the body 14 without any openings thereby creating a Faraday enclosure. In other embodiments, the lid 12 and the body 14 may be in varying shapes, sizes, or configurations. The one or more securement members 15 may comprise fasteners. In still other embodiments, the lid 12 may be attached to the body 14 using any type of securement member such as a hinge, or other securement member. The lid 12 and the body 14 may be printed using 3D printing, may be molded, or may be made using varying manufacturing processes. The lid 12 and the body 14 may be made of at least one material that does not allow electromagnetic waves to enter the cavity 18, is thermally conductive, and comprises a metamaterial or a composite material. For instance, the lid 12 and the body 14 may be made of aluminum, metals, carbon fibers, plastics, or other types of materials.

As shown in FIGS. 1 and 3, a plurality of spaced-apart module securement members 20 are attached widthwise 22 between the opposed lengthwise side surfaces 14b and 14c within the cavity 18 to the body 14. The plurality of spaced-apart module securement members 20 may be manufactured into the cavity 18 of the body 14 using 3D printing, may be molded, or may be manufactured or attached within the cavity 18 of the body 14 using varying methods. The plurality of spaced-apart module securement members 20 may be thermally conductive and may comprise spaced-apart, thermally conductive rails. In one embodiment, the plurality of spaced-apart module securement members 20 may be made metals, carbon fibers, plastics, or other types of materials.

Another module securement member 24, which may also be thermally conductive and which may also comprise a thermally conductive rail, extends lengthwise 26 between the opposed widthwise end surfaces 14d and 14e along the top surface 14a within the cavity 18 of the body 14 between and in contact with the plurality of spaced-apart module securement members 20. The another module securement member 24 may be disposed perpendicularly to the plurality of spaced-apart module securement members 20. The another module securement members 24 may be manufactured into the cavity 18 of the body 14 using 3D printing, may be molded, or may be manufactured or attached within the cavity 18 of the body 14 using varying methods. In one embodiment, the another module securement members 24 may be made of metals, carbon fibers, plastics, or other types of materials. In other embodiments, the spaced-apart module securement members 20 and the module securement member 24 may vary in material, size, number, or configuration. For instance, in one embodiment, the another module securement member 24 may be attached to the lid 12.

As shown in FIGS. 1 and 3, a backplane 28 is attached to the lid 12. In other embodiments, the backplane 28 may be attached to the body 14. The backplane 28 may be attached to the lid 12 using one or more securement members 30. The one or more securement members 30 may comprise fasteners. In still other embodiments, the backplane 28 may be attached to the lid 12 using any type of securement member, due to a molded attachment, or using another type of attachment method. The backplane 28 comprises an electrically conductive material such as metals, carbon fibers, electrically conductive plastics, or other types of materials.

As shown in FIGS. 1-4, a plurality of electrically conductive connectors 32 are attached to the widthwise end surface 14d and extend from outside 33 the body 14 to within the cavity 18. The plurality of electrically conductive connectors 32 may be molded to the widthwise end surface 14d. In other embodiments, the plurality of electrically conductive connectors 32 may be attached to the widthwise end surface 14d in varying ways. The plurality of electrically conductive connectors 32 are adapted to be connected to one or more devices 34. The one or more devices 34 may comprise a power device, a data device, or another type of device for sending or receiving power or data through the plurality of electrically conductive connectors 32. In other embodiments, the plurality of electrically conductive connectors 32 may be attached to the lid 12. In still other embodiments, the plurality of electrically conductive connectors 32 may vary in number, size, configuration, location relative to the body 14 or the lid 12, type, or attachment method. The plurality of electrically conductive connectors 32 are connected to the backplane 28 with a connection 36, which may be wired or wireless, for allowing electricity or data to flow between the electrically conductive connectors 32 and the backplane 28.

The plurality of electronic modules 16 shown in FIGS. 1 and 3 may comprise any type and number of electronic module such as a commercial off-the-shelf electronic module, a processor module, a memory module, a power supply module, an input/output module, or another type of electronic module needing environmental protection. The plurality of electronic modules 16 may be slideably inserted between the plurality of spaced-apart module securement members 20 into the cavity 18 of the body 14 while the lid 12 is detached from the body 14 as shown in FIG. 1, and the lid 12 may subsequently be attached to the body 14 as shown in FIGS. 2 and 3 to put the plurality of electronic modules 16 into contact with the backplane 28 of the lid 12. In other embodiments in which the backplane 28 is attached to the body 14, the plurality of electronic modules 16 may immediately come into contact with the backplane 28 when inserted into the cavity 18 of the body 14 with the lid 12 removed from the body 14.

As shown in FIGS. 1-3, the plurality of electronic modules 16 are contained and extended widthwise 22 between the opposed lengthwise side surfaces 14b and 14c within the cavity 18 of the body 14 between the plurality of spaced-apart module securement members 20. The plurality of spaced-apart module securement members 20 hold the electronic modules 16 in place within the cavity 18 in the lengthwise direction 26, the opposed lengthwise side surfaces 14b and 14c hold the electronic modules 16 in place within the cavity 18 in the widthwise direction 22, and the another module securement member 24 and the backplane 28 of the lid 12 hold the electronic modules in place in the heightwise direction 38 within the cavity 18 when the lid 12 is attached to the body 14. The plurality of electronic modules 16 may be held within the cavity 18 using components which are all molded to the body 14 or the lid 12. In other embodiments, the plurality of electronic modules 16 may be held within the cavity 18 using components which are attached to the body 14 or the lid 12 using varying attachment methods.

As shown in FIGS. 1-3, the plurality of electronic modules 16 are in contact with the backplane 28 of the lid 12, when the lid 12 is attached to the body 14, and are in wireless communication with the backplane 28. In such manner, the one or more devices 34 may be connected to the plurality of electrically conductive connectors 32, which are connected through the connection 36 to the backplane 28, and the backplane 28 may be connected to the plurality of electronic modules 16 wirelessly thereby transmitting power or data between the one or more devices 34 outside 33 of the cavity 18 and the electronic modules 16 held within the cavity 18. In still other embodiments, the plurality of electronic modules 16 may vary in number, size, configuration, location relative to the body 14 or the lid 12, type, or securement method.

FIG. 5 illustrates a perspective view of one of the plurality of electronic modules 16 of the embodiment of FIG. 1 with outer shells 40 and 42 of the electronic module 16 removed from the electronic module 16. The shells 40 and 42 may be attached to one another, at least partially enclosing the electronic module 16 between the shells 40 and 42, with attachment members 44. The attachment members 44 may comprise fasteners or other types of attachment members. The shells 40 and 42 may provide additional environmental protection to the electronic module 16 beyond the environmental protection already being provided by the chassis system 10 of FIGS. 1-4, and may be thermally conductive for dissipating heat from the electronic module 16, through the thermally conductive plurality of spaced-apart module securement members 20 shown in FIGS. 1-4, through the thermally conductive another module securement member 24 shown in FIGS. 1-4, and through the thermally conductive body 14 and lid 12 shown in FIGS. 1-4.

The shells 40 and 42 may be made of metals, carbon fibers, plastics, or other types of materials. The shells 40 and 42 may be manufactured using 3D printing, molding, or other manufacturing methods. It is further noted that the lid 12 and the body 14 of the chassis system 10 of FIGS. 1-4 further provide additional protection to the electronic modules 16 due to their being made of at least one material that does not allow electromagnetic waves to enter the cavity 18 in which the electronic modules 16 are environmentally protected within the chassis system 10.

As shown in FIG. 4, at least one metamaterial isolator 19 may be attached to the lid 12 and disposed against a structure 21, in which the chassis system 10 is installed, for reducing vibration of the chassis system 10. The structure 21 may comprise a portion of a vehicle, an aircraft, or other type of structure. In other embodiments, the at least one metamaterial isolator 19 may be attached to the body 14 for reducing vibration of the chassis system 10. The at least one metamaterial isolator 19 may be attached to the lid 12 using adhesive, fasteners, or through other attachment methods. The at least one metamaterial isolator 19 may be attached to the structure 21 using adhesive, fasteners, or through other attachment methods or may be disposed unattached against the structure 21. The at least one metamaterial isolator 19 may comprise circular metamaterial isolators attached at all four outer corners of the lid 12. The metamaterial isolators 19 may be made of metals, carbon fibers, plastics, or other types of materials. The metamaterial isolators 19 may be tuned to the resonate frequency of the electronic modules 16 shown in FIGS. 1-4 to help isolate the chassis system 10 in axes 46 and 48. In other embodiments, the metamaterial isolators 19 may vary in number, shape, size, configuration, location, type, material, or attachment.

FIG. 6 illustrates a side view of the chassis system 10 of FIG. 2 with a thermoelectric layer 50 and a shape memory alloy layer 52 attached to the lid 12 and disposed against a structure 54, in which the chassis system 10 is installed, for reducing vibration of the chassis system 10. The structure 54 may comprise a portion of a vehicle, an aircraft, a tray, a magnet, or other type of structure. In other embodiments, the thermoelectric layer 50 and the shape memory alloy layer 52 may be attached to the body 14 for reducing vibration of the chassis system 10. The thermoelectric layer 50 may be attached to the lid using adhesive, fasteners, or through other attachment methods. The shape memory alloy layer 52 may be attached to the thermoelectric layer 50 using adhesive, fasteners, or through other attachment methods. The shape memory alloy layer 52 may be attached to the structure 54 using adhesive, fasteners, or through other attachment methods or may be disposed unattached against the structure 54. The thermoelectric layer 50 may be made of bismuth chalcogenides, lead telluride and inorganic clathrates, or other types of materials. The shape memory alloy layer 52 may be nickel-based, copper-based, platinum-based, iron-based, or other types of shape memory alloys.

Use of the thermoelectric layer 50 and the shape memory alloy layer 52 may help isolate the chassis system 10 in axis 56. In other embodiments, the thermoelectric layer 50 and the shape memory alloy layer 52 may vary in number, shape, size, configuration, location, type, material, or attachment. The shape memory alloy layer 52 may generate heat when compressed and the thermoelectric layer 50 may convert the heat generated by the shape memory alloy layer 52 into electricity. The converted electricity may be used to power the structure 54, to power the electronic modules 16 shown in FIGS. 1-4, to power a magnet, comprising a portion of the structure 54, in order to reduce vibration of the chassis system 10, or to power another type of device or structure.

Figure 7:
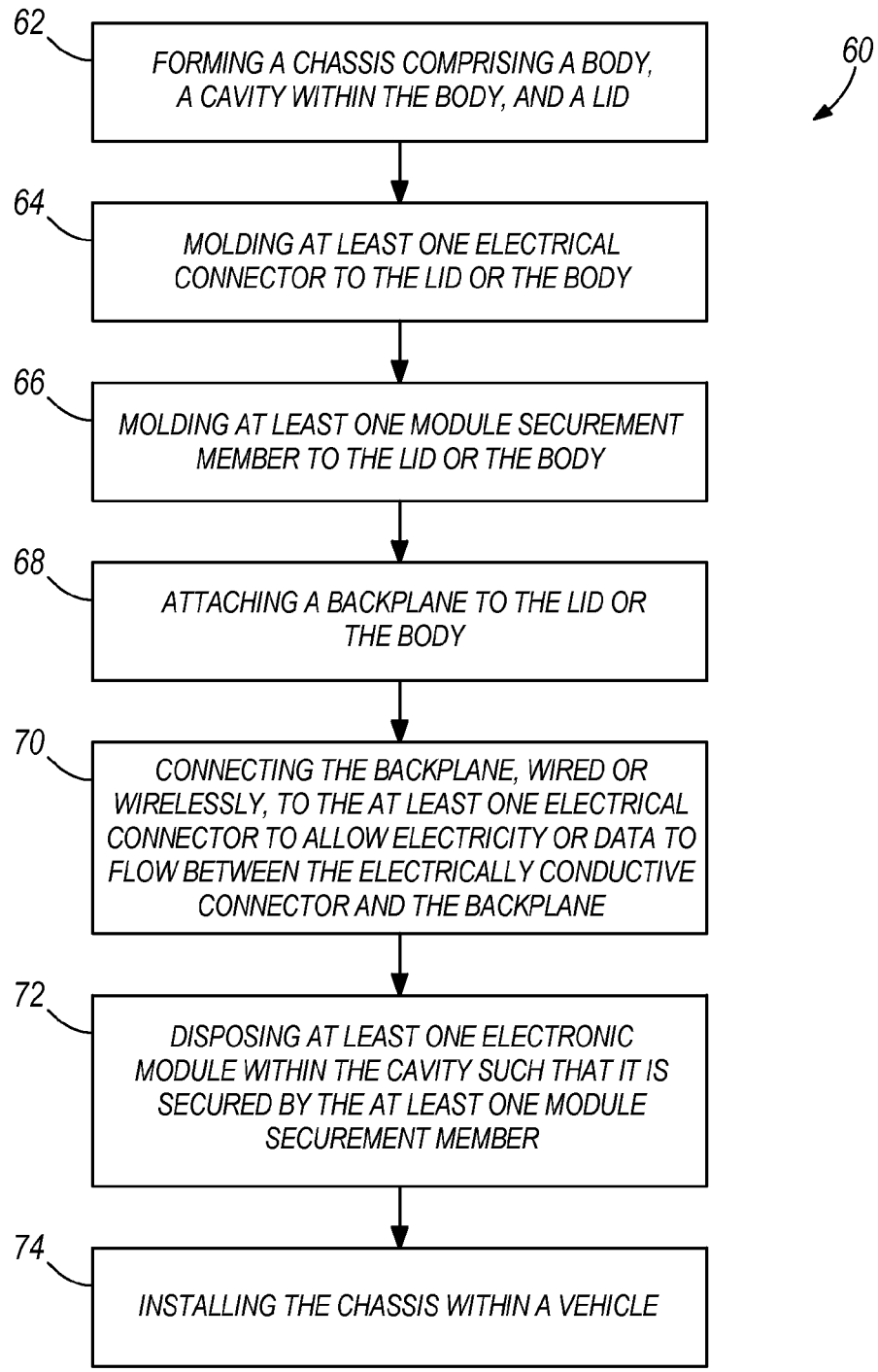
FIG. 7 is a flowchart illustrating one method of manufacturing a chassis.

FIG. 7 is a flowchart illustrating one method 60 of manufacturing a chassis. In step 62, a chassis is formed. The formed chassis may comprise a body, a cavity within the body, and a lid which when attached to the body the cavity is completely enclosed by the body and the lid. The chassis may be formed using 3D molding or another method. The body and the lid may be formed out of at least one material that does not allow electromagnetic waves to enter the cavity. The body or the lid may be formed out of a thermally conductive material, a metamaterial, a composite material, or another type of material. In step 64, at least one electrical connector is molded to the lid or the body. In step 66, at least one module securement member is molded to the lid or the body. In step 68, a backplane is attached to the lid or the body. In step 70, the backplane is connected, wired or wirelessly, to the at least one electrical connector to allow electricity or data to flow between the electrically conductive connector and the backplane.

In step 72, at least one electronic module may be disposed within the cavity such that it is secured by the at least one module securement member, is in contact with the backplane, and is in wireless communication with the backplane. The at least one electronic module may be slid into the cavity to be held in place by the module securement member while the lid is detached from the body. The backplane may make contact with the at least one electronic module when the lid is attached to the body. In another embodiment, the backplane may make contact with the at least one electronic module as soon as the at least one electronic module is slid into the cavity to be held in place by the module securement member while the lid is detached from the body. The at least one electronic module may be partially enclosed within a thermally conductive shell.

In step 74, the chassis may be installed within a vehicle such as an aircraft or another type of vehicle or structure. In another embodiment, at least one metamaterial isolator may be attached to the lid or the body to reduce vibration of the chassis. In still another embodiment, a thermoelectric layer and a shape memory alloy layer may be attached to the lid or the body with the shape memory alloy layer configured to generate heat when compressed and the thermoelectric layer configured to convert the heat generated by the shape memory alloy layer into electricity. In other embodiments, one or more steps of the method may be modified or not followed, the order of the steps may be changed, or one or more additional steps may be added.

By using 3D printing to form the chassis and by molding the electrically conductive connectors and the module securement members the necessity of the use of small parts, such as fasteners, and the need for manual labor to install the chassis and the electronic modules is reduced thereby reducing costs. Moreover, by using thermally conductive module securement members, a thermally conductive lid, and a thermally conductive body, heat from the electronic modules is more effectively dissipated than by using more costly wedgelocks as utilized in existing systems. Additionally, the use of wireless connections between the electronic modules and the backplane eliminates connector fretting caused by wear on the module connectors due to swaying of the electronic modules caused by vibration of the vehicle or structure in which the chassis is installed.

One or more embodiments of the disclosure may reduce one or more issues experienced by one or more of the existing apparatus and methods for holding and using electronic modules. For instance one or more embodiments of the disclosure may have one or more of the following advantages: the reduction of vibration in the chassis; creating power to be used for any purpose such as reducing vibration or to power the electronic modules or other devices; preventing electromagnetic waves from entering the chassis; providing wireless power or data between the backplane and the electronic module to eliminate connector fretting caused by wear on the module connectors due to swaying of the electronic modules caused by vibration of the vehicle or structure in which the chassis is installed; creating a chassis which is a Faraday enclosure; using 3D printing and molding to reduce the use of small parts, such as fasteners, and the need for manual labor thereby increasing efficiency and reducing costs; using thermally conductive components to dissipate heat, created by the electronic modules, more effectively than prior systems use of wedgelocks; using protective module shells which assist the chassis in thermally and environmentally protecting the electronic modules; and one or more additional advantages.

It should be understood, of course, that the foregoing relates to exemplary embodiments of the disclosure and that modifications may be made without departing from the spirit and scope of the disclosure as set forth in the following claims.

I claim:

1. A chassis system comprising:
   a body;
   a lid removably attached to the body such that when the lid is attached to the body a cavity within the body is completely enclosed by the body and the attached lid, the lid and the body made of at least one material that does not allow electromagnetic waves to enter the cavity;
   a backplane attached to the body or the lid;
   an electrically conductive connector attached to the body or lid, wherein the connector is in wired or wireless communication with the backplane for allowing electricity or data to flow between the electrically conductive connector and the backplane; and
   a thermoelectric layer and a shape memory alloy layer both attached to the lid or body, wherein the shape memory alloy layer is configured to generate heat when compressed and the thermoelectric layer is configured to convert the heat generated by the shape memory alloy layer into electricity.

2. The chassis system of claim 1 wherein the lid or the body is thermally conductive.

3. The chassis system of claim 1 wherein the lid or the body is made of a metamaterial or a composite material.

4. The chassis system of claim 1 further comprising a plurality of spaced-apart thermally conductive rails attached to the body within the cavity.

5. The chassis system of claim 4 further comprising another thermally conductive rail extending between and in contact with the plurality of spaced-apart thermally conductive rails.

6. The chassis system of claim 4 further comprising at least one electronic module contained within the cavity between the plurality of spaced-apart thermally conductive rails and in contact with the backplane.

7. The chassis system of claim 1 further comprising at least one electronic module contained within the cavity and in contact with the backplane with the at least one electronic module in wireless communication with the backplane.

8. The chassis system of claim 7 wherein the at least one electronic module is at least partially enclosed within a thermally conductive shell.

9. The chassis system of claim 1 wherein the chassis system comprises a portion of a vehicle or aircraft.

10. The chassis system of claim 1 further comprising at least one metamaterial isolator attached to the lid or the body for reducing vibration of the chassis system.

11. A chassis system comprising:
    a body;
    a lid removably attached to the body such that when the lid is attached to the body a cavity within the body is completely enclosed by the body and the attached lid, the lid and the body made of at least one material that does not allow electromagnetic waves to enter the cavity;
    a plurality of spaced-apart thermally conductive rails attached to the body within the cavity;
    a backplane attached to the body or the lid;
    at least one electronic module contained within the cavity between the plurality of spaced-apart thermally conductive rails and in contact with the backplane; an electrically conductive connector attached to the body or lid, wherein the electrically conductive connector is in wired or wireless communication with the backplane for allowing electricity or data to flow between the electrically conductive connector and the backplane; and
    a thermoelectric layer and a shape memory alloy layer both attached to the lid or body, wherein the shape memory alloy layer is configured to generate heat when compressed and the thermoelectric layer is configured to convert the heat generated by the shape memory alloy layer into electricity.

12. The chassis system of claim 11 wherein the lid or the body is thermally conductive.

13. The chassis system of claim 11 wherein the lid or the body is made of a metamaterial or a composite material.

14. The chassis system of claim 11 wherein the at least one electronic module is at least partially enclosed within a thermally conductive shell.

15. A method of manufacturing a chassis comprising:
    forming a chassis comprising a body, a cavity within the body, and a lid such that when the lid is attached to the body the cavity is completely enclosed by the body and the lid;
    molding at least one electrical connector to the lid or the body;
    molding at least one module securement member to the lid or the body;
    attaching a backplane to the lid or the body;
    connecting, wired or wirelessly, the backplane to the at least one electrical connector to allow electricity or data to flow between the at least one electrical connector and the backplane; and
    attaching a thermoelectric layer and a shape memory alloy layer to the lid or body, with the shape memory alloy layer configured to generate heat when compressed and the thermoelectric layer configured to convert the heat generated by the shape memory alloy layer into electricity.

16. The method of claim 15 further comprising forming the chassis using 3D printing.

17. The method of claim 15 further comprising forming the body and the lid out of at least one material that does not allow electromagnetic waves to enter the cavity.

18. The method of claim 15 further comprising forming the body or the lid out of a thermally conductive material.

19. The method of claim 15 further comprising forming the body or the lid out of a metamaterial or a composite material.

20. The method of claim 15 further comprising disposing at least one electronic module within the cavity such that it is secured by the at least one module securement member, is in contact with the backplane, and is in wireless communication with the backplane.

21. The method of claim 20 further comprising at least partially enclosing the electronic module within a thermally conductive shell.

22. The method of claim 15 further comprising installing the chassis in a vehicle.

23. The method of claim 15 further comprising attaching at least one metamaterial isolator to the lid or the body to reduce vibration of the chassis.

* * * * *